United States Patent
Neuendorffer et al.

(10) Patent No.: US 7,525,343 B1
(45) Date of Patent: Apr. 28, 2009

(54) METHOD AND APPARATUS FOR ACCESSING INTERNAL REGISTERS OF HARDWARE BLOCKS IN A PROGRAMMABLE LOGIC DEVICE

(75) Inventors: Stephen A. Neuendorffer, San Jose, CA (US); Brandon J. Blodget, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/004,938

(22) Filed: Dec. 20, 2007

(51) Int. Cl.
*H03K 19/177* (2006.01)
(52) U.S. Cl. .......................... 326/40; 326/38
(58) Field of Classification Search ............. 326/37–41, 326/47
See application file for complete search history.

(56) References Cited

U.S. PATENT DOCUMENTS

| | | | | |
|---|---|---|---|---|
| 5,801,547 A * | 9/1998 | Kean | ............................. | 326/40 |
| 7,362,132 B2 * | 4/2008 | Imafuku | ....................... | 326/38 |
| 7,375,549 B1 * | 5/2008 | Tang et al. | .................... | 326/38 |

* cited by examiner

*Primary Examiner*—James H Cho
(74) *Attorney, Agent, or Firm*—Robert M. Bush

(57) ABSTRACT

A method and apparatus for accessing internal registers of hardware blocks in a programmable logic device (PLD) are described. An aspect of the invention relates to a method of accessing at least one internal register of a hardware block in a PLD. The PLD is actively reconfigured with a first partial bitstream to sever first connections between input/output (IO) pins of the hardware block and a user design, and establish second connections between the IO pins and state access logic. The at least one internal register is accessed using the state access logic. The PLD is actively reconfigured with a second partial bitstream to establish third connections between the IO pins and the user design.

20 Claims, 8 Drawing Sheets

US 7,525,343 B1

METHOD AND APPARATUS FOR ACCESSING INTERNAL REGISTERS OF HARDWARE BLOCKS IN A PROGRAMMABLE LOGIC DEVICE

FIELD OF THE INVENTION

One or more aspects of the present invention relate generally to programmable logic devices and, more particularly, to a method and apparatus for accessing internal registers of hardware blocks in a programmable logic device (PLD).

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured. Some FPGAs allow for dynamic, partial reconfiguration while active.

An FPGA may also include various dedicated logic circuits as programmable elements among the CLBs and IOBs (referred to as hardware blocks). Such hardware blocks include memories, digital clock managers (DCMs), and input/output (I/O) transceivers, embedded processors, digital signal processors (DSPs), multipliers, and the like. Notably, some hardware blocks include internal registers that are less accessible that other registers in the PLD (e.g., registers in a CLB). For example, a hardware block may include internal registers that cannot be independently set or read back during partial reconfiguration of the PLD (whereas registers in a CLB, for example, can be set and read back during partial reconfiguration). Moreover, the state of some internal registers in a hardware block may always be zero in response to a synchronous reset. Examples of such internal registers include pipeline registers in DSP and multiplier hardware blocks.

The reduced accessibility of internal registers in a hardware block may prevent certain use scenarios and can increase design area. Presently, if a user desires to initialize internal registers, the design requires insertion of extra registers in the data path of the hardware block that are capable of being initialized. Furthermore, the reduced accessibility of internal registers in a hardware block may reduce circuit throughput (e.g., if initializable registers are inserted in a feedback loop). Accordingly, there exists a need in the art for a method and apparatus for accessing at least one internal register of a hardware block in a PLD that overcomes the aforementioned deficiencies.

SUMMARY OF THE INVENTION

An aspect of the invention relates to a method of accessing at least one internal register of a hardware block in a programmable logic device (PLD). The PLD is actively reconfigured with a first partial bitstream to sever first connections between input/output (IO) pins of the hardware block and a user design, and establish second connections between the IO pins and state access logic. The at least one internal register is accessed using the state access logic. The PLD is actively reconfigured with a second partial bitstream to establish third connections between the IO pins and the user design.

Another aspect of the invention relates to an apparatus for accessing at least one internal register of a hardware block in a PLD. State access logic is configured to access the at least one internal register in response to active reconfiguration of the PLD with a first partial bitstream. The first partial bitstream severs first connections between IO pins of the hardware block and a user design and establishes second connections between the IO pins and the state access logic. The state access logic is further configured to trigger active reconfiguration of the PLD with a second partial bitstream that establishes third connections between the IO pins and the user design.

Another aspect of the invention relates to a programmable logic system. A PLD includes a user design configured therein, a hardware block, state access logic, and configuration logic. The hardware block includes at least one internal register and IO pins coupled to the user design. The state access logic is configured to access the at least one internal register in response to a first active reconfiguration of the PLD. The configuration logic is configured to initiate the first active reconfiguration using a first partial bitstream that severs first connections between the IO pins and the user design and establishes second connections between the IO pins and the state access logic. The configuration logic is further configured to initiate a second active reconfiguration using a second partial bitstream that establishes third connections between the IO pins and the user design.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
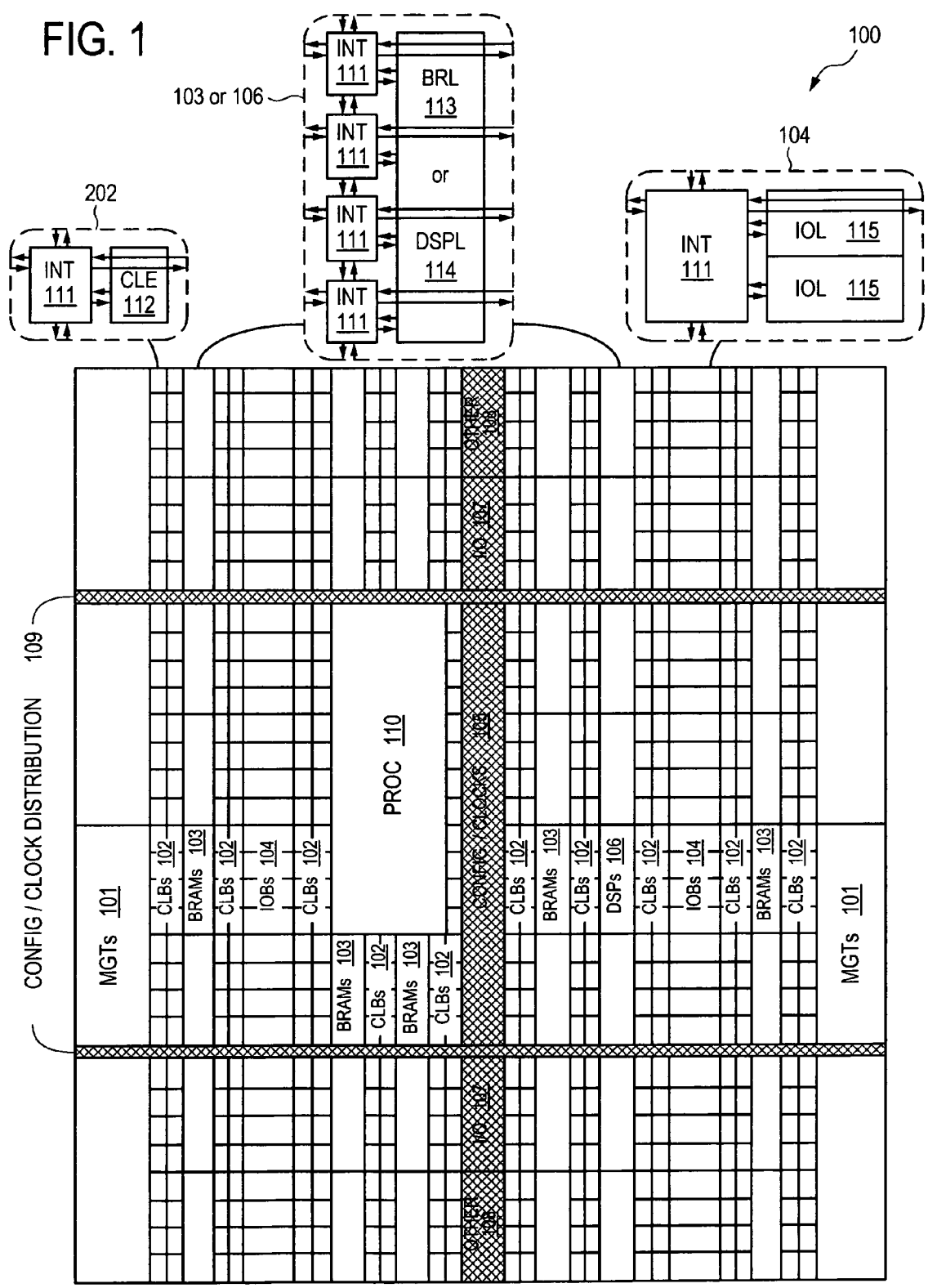
FIG. 1 is a block diagram depicting an exemplary embodiment of an FPGA in accordance with one or more aspects of the invention.

FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. A given set of programmable tiles of an FPGA is referred to herein as a programmable fabric of the FPGA.

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 also includes one or more dedicated processor blocks (PROC 110). The processor block 110 comprises a microprocessor core, as well as associated control logic. Notably, such a microprocessor core may include embedded hardware or embedded firmware or a combination thereof for a "hard" or "soft" microprocessor. A soft microprocessor may be implemented using the programmable logic (e.g., CLBs, IOBs). For example, a MICROBLAZE soft microprocessor, available from Xilinx of San Jose, Calif., may be employed. A hard microprocessor may be implemented using an IBM POWER PC, Intel PENTIUM, AMD ATHLON, or like type processor core known in the art. The processor block 110 is coupled to the programmable logic of the FPGA in a well known manner.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the FPGA die. Configuration information for the programmable logic is stored in configuration memory. The configuration logic 105 provides an interface to, and loads configuration data to, the configuration memory. A stream of configuration data ("configuration bitstream") may be coupled to the configuration logic 105, which in turn loads the configuration memory. Notably, the configuration logic 105 is configured to support the loading of partial configuration bitstreams while the FPGA is active. This allows for reconfiguration of portions of the FPGA during runtime. The configuration and reconfiguration process for the FPGA is well known in the art.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

Figure 2:
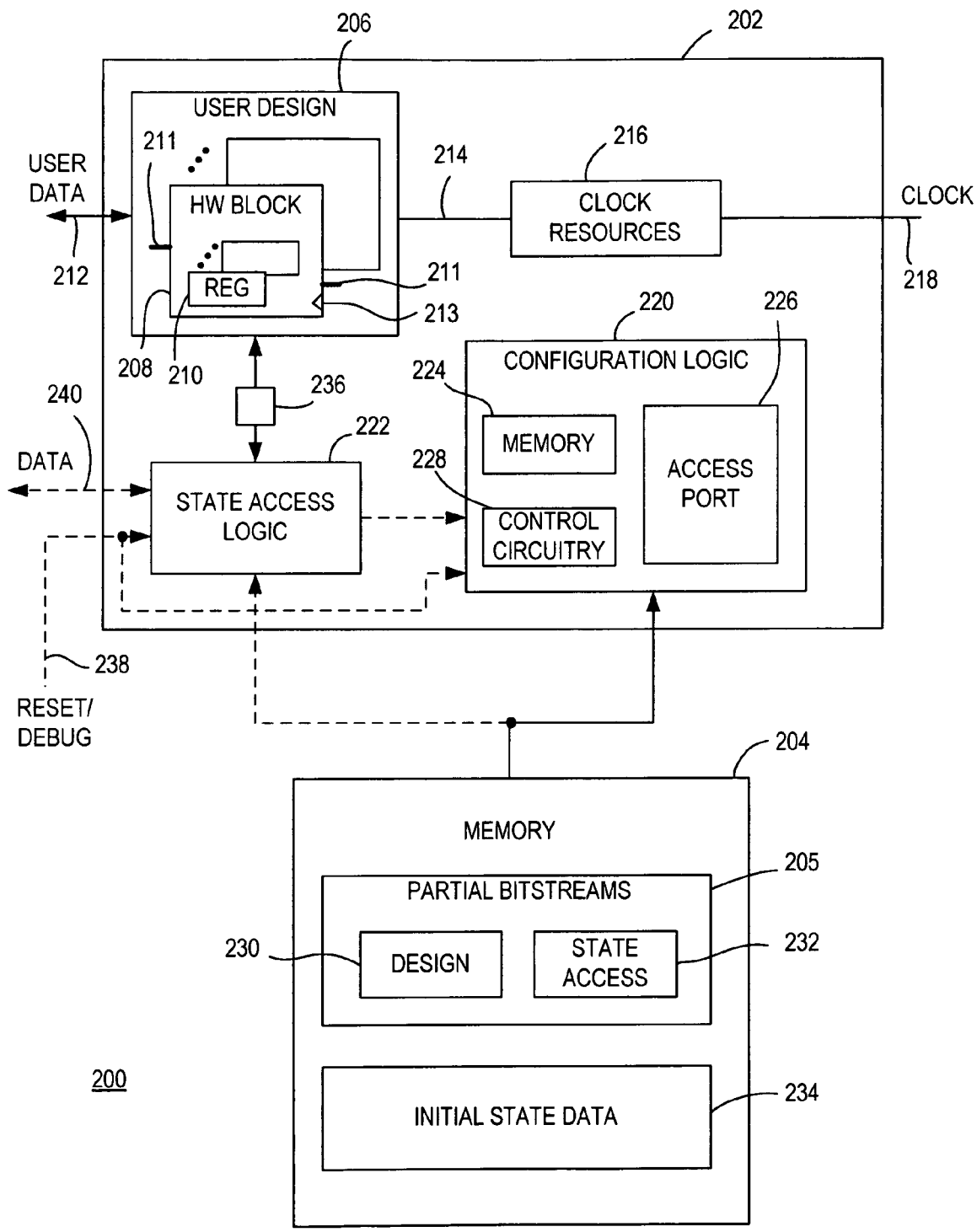
FIG. 2 is a block diagram depicting an exemplary embodiment of a programmable logic system in accordance with one or more aspects of the invention.

FIG. 2 is a block diagram depicting an exemplary embodiment of a programmable logic system 200 in accordance with one or more aspects of the invention. The system 200 includes a programmable logic device (PLD) 202 coupled to a memory 204. The PLD 202 may comprise an FPGA or the like having an architecture similar to that of FIG. 1. The memory 204 may comprise a non-volatile memory, such as a FLASH memory, EPROM, or the like. The PLD 202 may be configured with a user design 206. The PLD 202 may further include clock resources 216, configuration logic 220, and state access logic 222. The configuration logic 220 includes configuration memory 224, a configuration access port 226, and configuration control circuitry 228. In general, the configuration control circuitry 228 receives configuration bitstreams ("bitstreams") via the configuration access port 226 and loads the configuration memory 224 with configuration data carried by the bitstreams.

The user design 206 may utilize one or more dedicated circuits in the programmable fabric ("hardware blocks 208") in addition to configured CLBs, IOBs, and the like. The user design 206 may include an input/output (IO) data path 212 for transmitting/receiving user data. The user design 206 further includes a clock pin 214 coupled to the clock resources 216. The clock resources 216 generate one or more clock signals that drive synchronous circuit elements in the user design 206. The clock resources 216 may generate all or a portion of the clock signals internally, or may generate all or a portion of the clock signals in response to an external clock signal on a clock pin 218 of the PLD 202.

Each of the hardware blocks 208 includes one or more internal registers 210, a plurality of input/output (IO) pins 211, and a plurality of clock pins 213. By "internal" it is meant that the registers 210 cannot be set or read by the configuration logic 220. That is, the internal registers 210 are not accessible by programming bits in a configuration bitstream and loading such bits into the configuration memory 224. The internal registers 210 may also be initialized with a default state in response to reset of the PLD 202 (e.g., initialized with a logic '0' state). The IO pins 211 provide the external interface of the hardware blocks 208 to the user design 206. Thus, the user design 206 is coupled to the IO pins 211 to provide data to, and receive data from, the hardware blocks 208. Notably, the user design 206 may be coupled to the IO pins 211 via the programmable interconnect of the PLD 202 (e.g., routing resources). The clock pins 213 are coupled to a clock source utilized by the user design 206. An exemplary embodiment of a hardware block and its relation to the user design 206 is described below.

The memory 204 is configured to store partial bitstreams 205. The partial bitstreams 205 provide for partial reconfiguration of the user design 208 during runtime (also referred to as active reconfiguration or dynamic reconfiguration). That is, the user design 208 may comprise a plurality of modules, some of which are reconfigurable modules. The reconfigurable modules are capable of being re-programmed during runtime. The mechanism for such reconfiguration is a partial bitstream, which only includes configuration data for reconfiguring one or more target reconfigurable modules. Such a partial reconfiguration mechanism is well known in the art. As described further below, the partial bitstreams 206 include design bitstreams 230 and state access bitstreams 232. The memory 204 may further store initial state data 234, the use of which is described below.

The state access logic 222 is configured to access the internal registers 210 through a programmable path 236. The programmable path 236 may be implemented using the programmable interconnect of the PLD 202, dedicated interconnect in the PLD 202, or a combination of programmable and dedicated interconnect. In some embodiments, the state access logic 222 is coupled to the memory 204 for receiving partial bitstreams 205 and/or initial state data 228. In some embodiments, the state access logic 222 is coupled to the configuration logic 220 for providing partial bitstreams thereto. In some embodiments, the state access logic 222 is coupled to one or more control pins 238 of the PLD 202, such as a reset pin, a debug pin, or the like. In some embodiments, the state access logic 222 is coupled to a data pin 240 of the PLD 202 for providing output data. These various embodiments are described in more detail below.

Operation of the system 200 may be divided into three separate scenarios. In a first scenario, the PLD 202 is active and the user design 206 is operating according to design (e.g., processing user data on path 212 using the hardware blocks 208 and/or other configured circuits). In a second scenario, state values of the internal registers 210 are initialized by the state access logic 222 during a partial reconfiguration process. In a third scenario, state values of the internal registers 210 are read back using the state access logic 222 during a partial reconfiguration process. These scenarios are described in more detail below.

Figure 3:
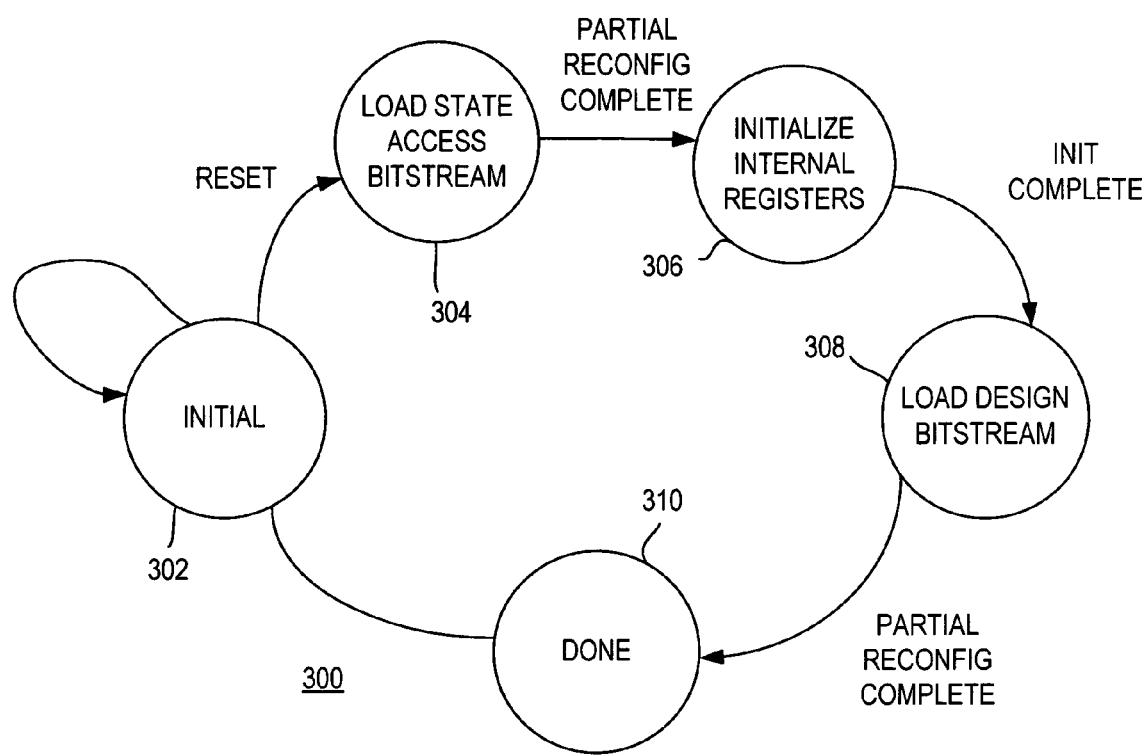
FIG. 3 is a state diagram depicting an exemplary embodiment of a method of accessing at least one internal register of a hardware block in a PLD in accordance with one or more aspects of the invention.

FIG. 3 is a state diagram depicting an exemplary embodiment of a method 300 of accessing at least one internal register of a hardware block in a PLD in accordance with one or more aspects of the invention. For purposes of exposition, the method 300 is described with respect to the internal registers 210 of the hardware blocks 208 in the programmable logic system 200 of FIG. 2.

The method 300 begins in an initial state 302. The initial state 302 represents the first operational scenario described above wherein the PLD 202 is active and the user design 206 is operating according to design. The method 300 remains in the initial state 302 until a reset command is received. A reset command may be used to initiate partial reconfiguration of the PLD 202, namely, the user design 206, as well as an initialization of the internal registers 210. In response to the reset command, the method 300 transitions from state 302 to a state 304.

At state 304, the PLD is actively reconfigured with a state access bitstream (also referred to as a first partial bitstream). The state access bitstream configures the user design 206 such that connections (first connections) between the IO pins 211 of the hardware blocks 208 and the user design 206 are severed, and connections (second connections) between the IO pins 211 and the state access logic 222 are established. That is, the user design 206 is disconnected from the IO pins 211 and thus isolated from the hardware blocks 208. The state access logic 222 is in turn coupled to the IO pins 211 and is capable of inputting data to the hardware blocks 208. In addition, a clock source coupled to the clock pins 213 of the hardware blocks 208 is switched from that of the user design 206 (first clock source) to another clock source used by the state access logic 222 (second clock source).

When the partial reconfiguration process is complete, the method 300 transitions from the state 304 to a state 306. At state 306, state values in the internal registers 210 are set by the state access logic 222. That is, the state access logic 222 initializes the internal registers 210 of the hardware blocks 208. As described below, such initialization is achieved by loading appropriate data into the IO pins 211 of the hardware blocks 208 such that the internal registers 210 store desired values. The appropriate data depends on the particular functions of the hardware blocks 208 given input data.

When initialization is complete, the method 300 transitions from the state 306 to a state 308. At state 308, the PLD is actively reconfigured with a design bitstream (also referred to as a second partial bitstream). The design bitstream configures the user design 206 such that connections (third connections) between the IO pins 211 of the hardware blocks 208 and the user design 206 are established. Incidentally, the connections between the IO pins 211 and the state access logic 222 are severed. That is, the state access logic 222 is disconnected from the IO pins 211 and thus isolated from the hardware blocks 208. The user design 206 is again coupled to the IO pins 211 and is capable of communicating with the hardware blocks 208. In addition, a clock source coupled to the clock pins 213 of the hardware blocks 208 is switched from that of the state access logic 222 to that used by the user design 206. When the partial reconfiguration process is complete, the method 300 transitions from the state 308 to the state 310. At the state 310, a reset-done signal is asserted and the method 300 transitions back to the state 302.

Figure 4:
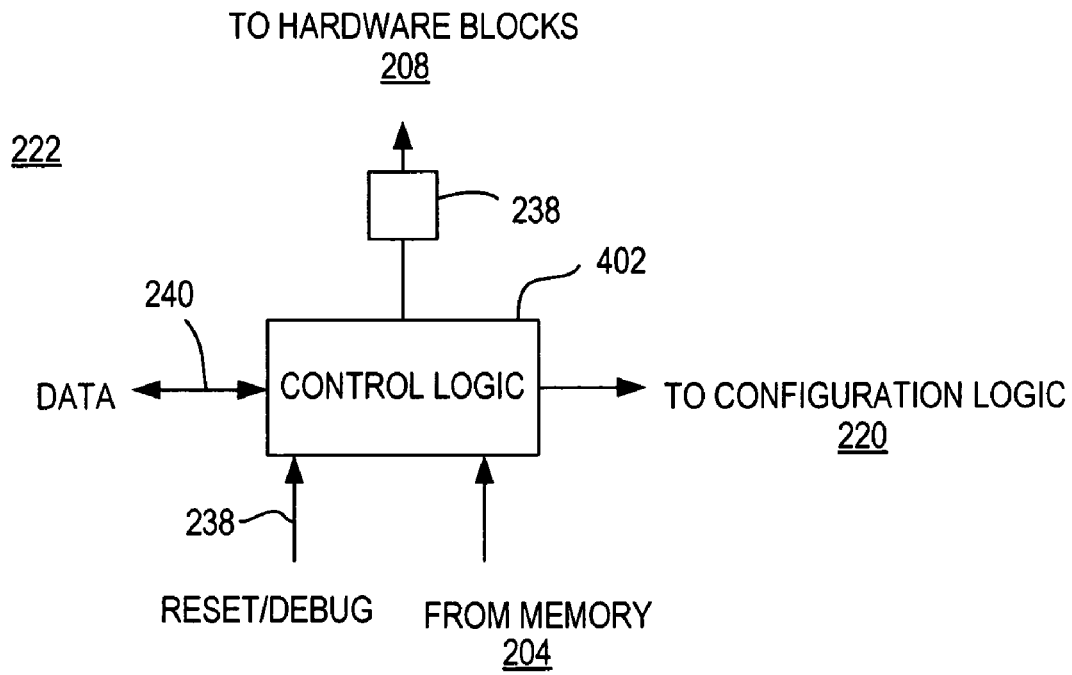
FIG. 4 is a block diagram depicting an exemplary embodiment of state access logic in accordance with one or more aspects of the invention.

FIG. 4 is a block diagram depicting an exemplary embodiment of the state access logic 222 in accordance with one or more aspects of the invention. Aspects of the present embodiment are related to the method 300 of FIG. 3. The state access logic 222 comprises control logic 402. The control logic 402 implements a control state machine that performs the method 300 of FIG. 3. In some embodiments, the control logic 402 is coupled to the memory 204 and the configuration logic 220. The control logic 402 is further coupled to the control pins 238. In operation, the control logic 402 detects a reset signal on the control pins 238. In response, the control logic 402 obtains a state access bitstream from the memory 204 and provides the state access bitstream to the configuration logic 220. The control logic 402 instructs the configuration logic 220 to initiate a partial reconfiguration process using the state access bitstream (state 304). Once the partial reconfiguration process is complete, the control logic 402 obtains initial state data for initializing the internal registers 210. In some embodiments, the control logic 402 may obtain the initial state data from the memory 204. Alternatively, the control logic 402 may obtain the initial state data from another external source (e.g., via the data pin 240).

In any case, the control logic 402 couples the initial state data to the IO pins 211 of the hardware blocks 208. That is, the clock signal used by the control logic 402 clocks the hardware blocks 208 such that the initial state data is loaded into the internal registers 210 (state 306). After initialization, the control logic 402 obtains a design bitstream from the memory 204 and provides the design bitstream to the configuration logic 220. The control logic 402 instructs the configuration logic 220 to initiate a partial reconfiguration process using the design bitstream (state 308). Once the partial reconfiguration process is complete, the control logic 402 asserts the reset-done signal (state 310).

Figure 5:
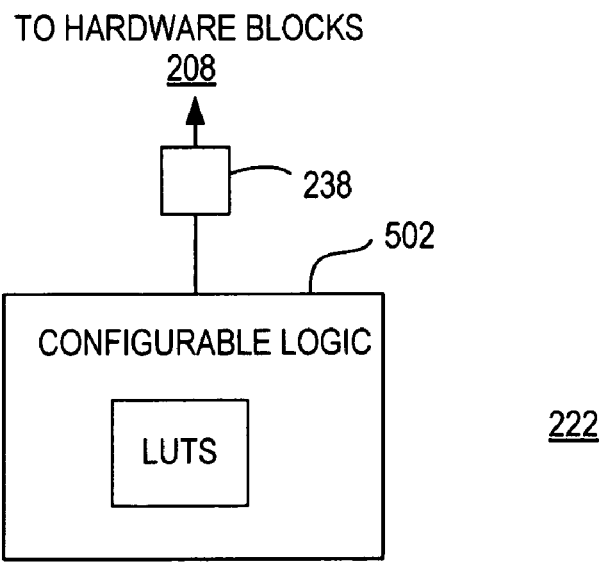
FIG. 5 is a block diagram depicting another exemplary embodiment of state access logic in accordance with one or more aspects of the invention.

FIG. 5 is a block diagram depicting another exemplary embodiment of the state access logic 222 in accordance with one or more aspects of the invention. Aspects of the present embodiment are related to the method 300 of FIG. 3. In the present embodiment, the state access logic 222 comprises configurable logic 502 in the PLD 202. The configuration control circuitry 228 implements a control state machine that performs the method 300 of FIG. 3. In operation, the configuration control circuitry 228 detects a reset signal on the control pins 238. In response, the configuration control circuitry 228 obtains a state access bitstream from the memory 204. The configuration control circuitry 228 initiates a partial reconfiguration process using the state access bitstream (state 304). In the present embodiment, the state access bitstream is configured to program the configuration memory 224 such that the configurable logic 502 generates initial state data for initializing the internal registers 210. The configurable logic 502 may include CLB elements in the PLD 202. In some embodiments, the configurable logic 502 includes one or more LUTs. The LUTs may be programmed via the state access bitstream to generate an output value, which in turn can be used to initialize the internal registers 210.

The configuration control circuitry 228 then initiates coupling of the initial state data to the IO pins 211 of the hardware blocks 208. For example, the clock signal used by the configurable logic 502 clocks the hardware blocks 208 such that the initial state data is loaded into the internal registers 210 (state 306). After initialization, the configuration control circuitry 228 obtains a design bitstream from the memory 204 and initiates a partial reconfiguration process using the design bitstream (state 308). Once the partial reconfiguration process is complete, the configuration control circuitry 228 asserts the reset-done signal (state 310).

Figure 6:
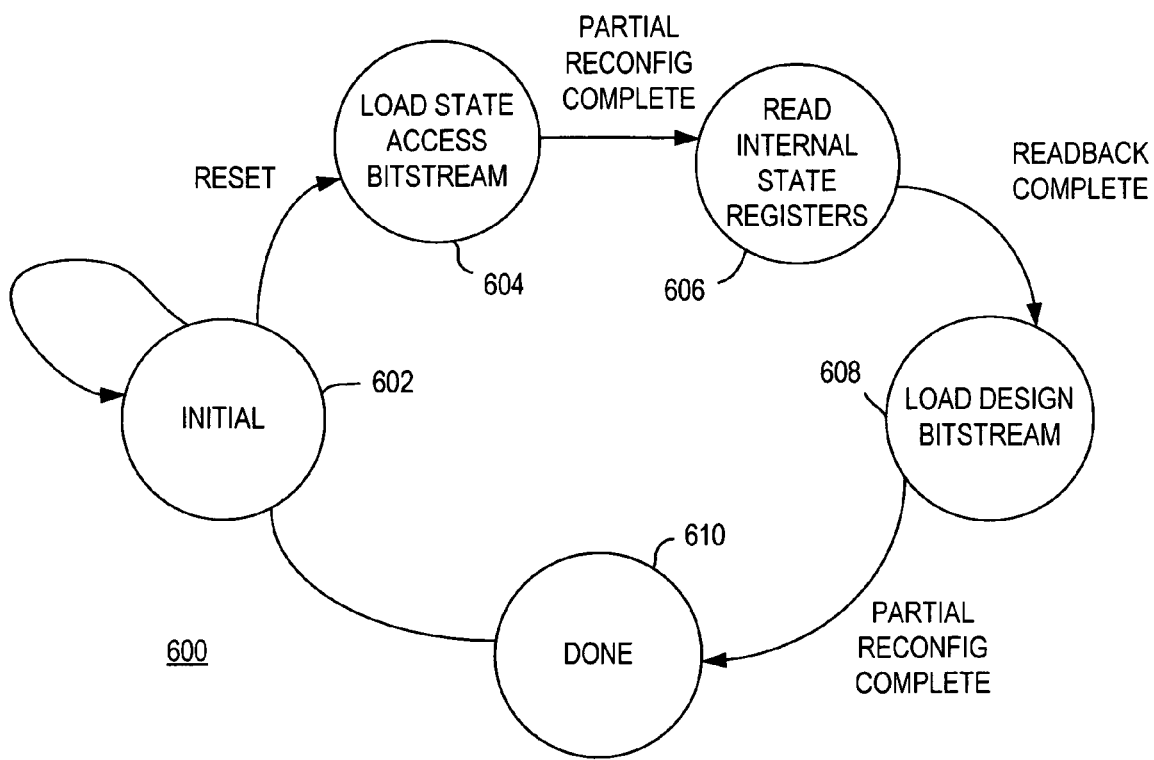
FIG. 6 is a state diagram depicting another exemplary embodiment of a method of accessing at least one internal register of a hardware block in a PLD in accordance with one or more aspects of the invention.

FIG. 6 is a state diagram depicting another exemplary embodiment of a method 600 of accessing at least one internal register of a hardware block in a PLD in accordance with one or more aspects of the invention. For purposes of exposition, the method 600 is described with respect to the internal registers 210 of the hardware blocks 208 in the programmable logic system 200 of FIG. 2. While the method 300 may be used to initialize the internal registers 210, the method 600 may be used to read back state values from the internal registers 210 (i.e., the third operational scenario described above).

In particular, the method 600 begins in an initial state 602. The initial state 602 represents the first operational scenario described above wherein the PLD 202 is active and the user design 206 is operating according to design. The method 600 remains in the initial state 602 until a debug command or like type command is received. A debug command may be used to initiate a readback operation for the PLD 202, namely, the user design 206. In response to the debug command, the method 600 transitions from state 602 to a state 604.

At state 604, the PLD is actively reconfigured with a state access bitstream (also referred to as a first partial bitstream). The state access bitstream configures the user design 206 such that connections (first connections) between the IO pins 211 of the hardware blocks 208 and the user design 206 are severed, and connections (second connections) between the IO pins 211 and the state access logic 222 are established. That is, the user design 206 is disconnected from the IO pins 211 and thus isolated from the hardware blocks 208. The state access logic 222 is in turn coupled to the IO pins 211 and is capable of inputting data to the hardware blocks 208. In addition, a clock source coupled to the clock pins 213 of the hardware blocks 208 is switched from that of the user design 206 (first clock source) to another clock source used by the state access logic 222 (second clock source).

When the partial reconfiguration process is complete, the method 600 transitions from the state 604 to a state 606. At state 606, state values in the internal registers 210 are read by the state access logic 222. That is, the state access logic 222 reads state values stored in the internal registers 210 of the hardware blocks 208. Such readback may be achieved by loading appropriate data into the IO pins 211 of the hardware blocks 208 such that the state values in the internal registers 210 are "shifted out" of the hardware blocks 208 through the IO pins 211. The appropriate data depends on the particular functions of the hardware blocks 208 given input data.

When initialization is complete, the method 600 transitions from the state 606 to a state 608. At state 608, the PLD is actively reconfigured with a design bitstream (also referred to as a second partial bitstream). The design bitstream configures the user design 206 such that connections (third connections) between the IO pins 211 of the hardware blocks 208 and the user design 206 are established. Incidentally, the connections between the IO pins 211 and the state access logic 222 are severed. That is, the state access logic 222 is disconnected from the IO pins 211 and thus isolated from the hardware blocks 208. The user design 206 is again coupled to the IO pins 211 and is capable of communicating with the hardware blocks 208. In addition, a clock source coupled to the clock pins 213 of the hardware blocks 208 is switched from that of the state access logic 222 to that used by the user design 206. When the partial reconfiguration process is complete, the method 600 transitions from the state 608 to the state 610. At the state 610, a debug-done signal is asserted and the method 600 transitions back to the state 602.

Returning to FIG. 4, the control logic 402 may implement a control state machine that performs the method 600 of FIG. 6. In operation, the control logic 402 detects a debug signal on the control pins 238. In response, the control logic 402 obtains a state access bitstream from the memory 204 and provides the state access bitstream to the configuration logic 220. The control logic 402 instructs the configuration logic 220 to initiate a partial reconfiguration process using the state access bitstream (state 604). Once the partial reconfiguration process is complete, the control logic 402 shifts out the state values in the internal registers 210 (state 606). The control logic 402 captures the shifted-out data and may output such data via the data pin 240 (or any other external port). After initialization, the control logic 402 obtains a design bitstream from the memory 204 and provides the design bitstream to the configuration logic 220. The control logic 402 instructs the configuration logic 220 to initiate a partial reconfiguration process using the design bitstream (state 608). Once the partial reconfiguration process is complete, the control logic 402 asserts the reset-done signal (state 610).

Figure 7:
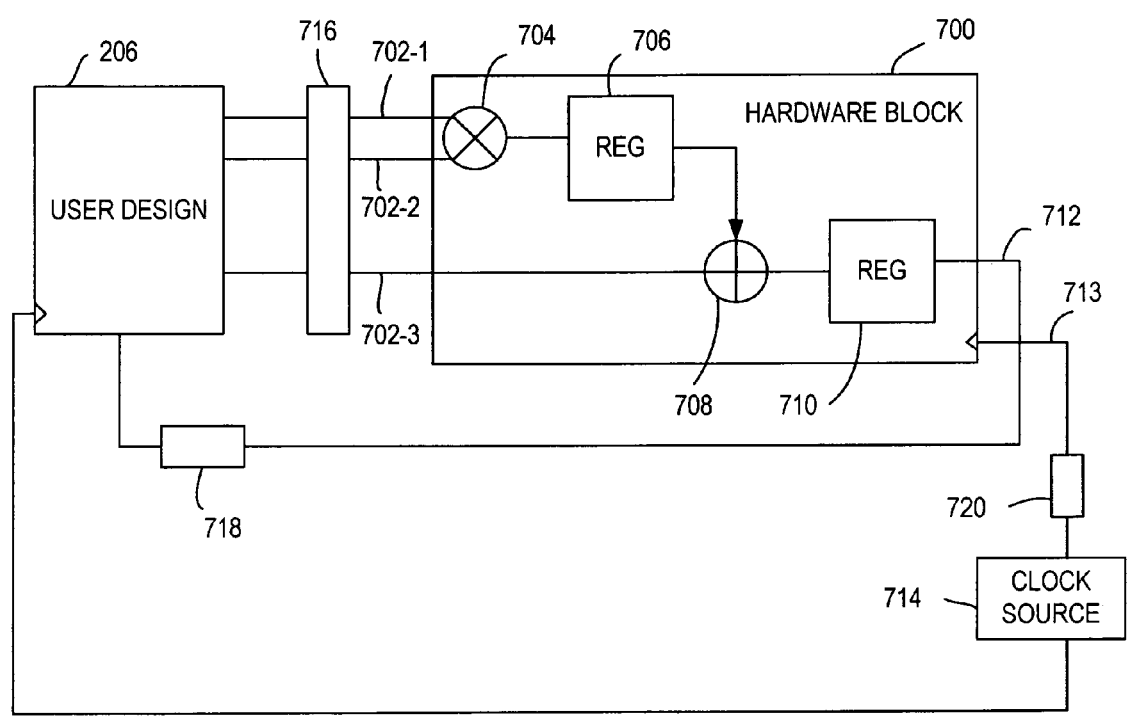
FIG. 7 is a block diagram depicting an exemplary embodiment of a hardware block as used in a user design in accordance with one or more aspects of the invention.
Figure 8:
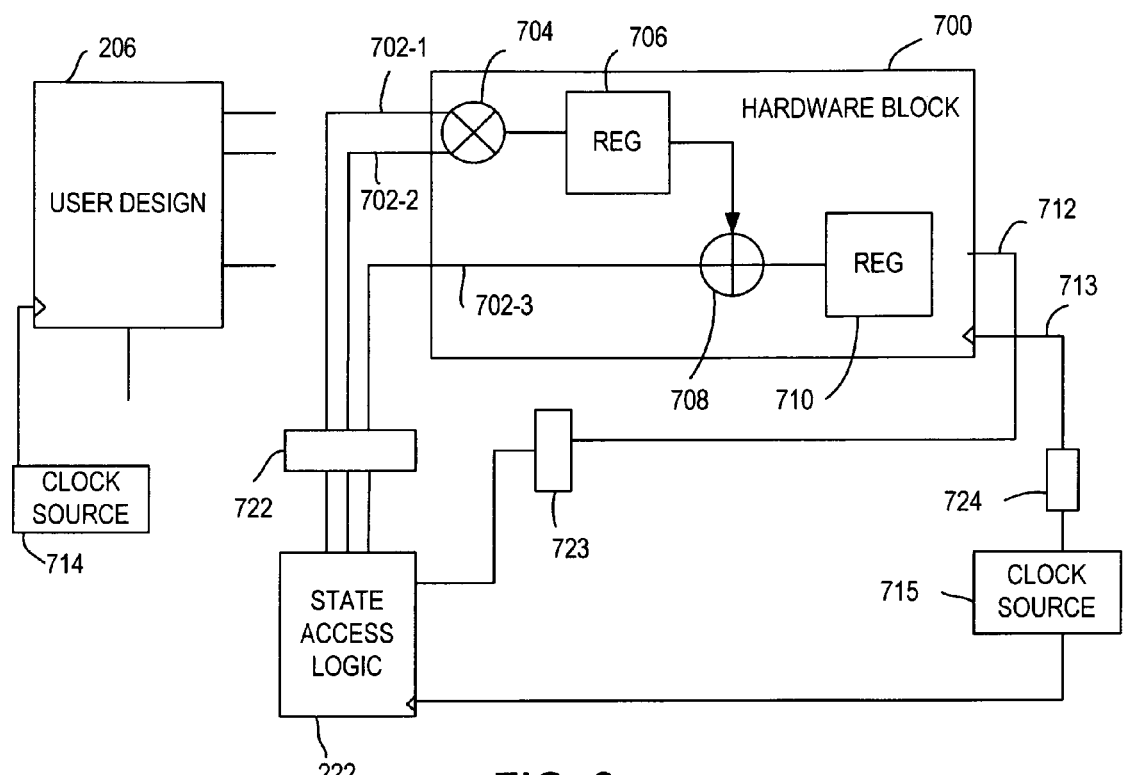
FIG. 8 is a block diagram depicting the hardware block of FIG. 7 as used during state access by state access logic in accordance with one or more aspects of the invention.

An exemplary embodiment of a hardware block is now described and related to the aspects of the invention described above. FIG. 7 is a block diagram depicting an exemplary embodiment of a hardware block 700 as used in the user design 206 in accordance with one or more aspects of the invention. FIG. 8 is a block diagram depicting the hardware block 700 as used during state access by the state access logic 222 in accordance with one or more aspects of the invention.

The hardware block 700 includes three input pins 702-1 through 702-3 (collectively input pins 702), a multiplier 704, a register 706, an adder 708, a register 710, an output pin 712, and a clock pin 713. The input pins 702-1 and 702-2 are coupled to the multiplier 704, and the input pin 702-3 is coupled to the adder 708. An output of the multiplier 704 is coupled to an input of the register 706. An output of the register 706 is coupled to another input of the adder 708. An output of the adder 708 is coupled to an input of the register 710. An output of the register 710 is coupled to the output pin 712. Accordingly, this exemplary hardware block 700 comprises a simplified multiplier-accumulator circuit. Such a multiplier-accumulator circuit may be included as a dedicated logic circuit in the PLD 202 (e.g., as part of a DSP tile). The registers 706 and 710 comprise internal registers in that they are not accessible via the configuration logic 220. The clock pin 713 is coupled to synchronous elements in the hardware block 700, such as the registers 706 and 710 (connections omitted for clarity).

As shown in FIG. 7, the input pins 702 and the output pin 712 are coupled to the user design 206 via connections 716 and connections 718, respectively. The clock pin 713 is coupled to a clock source 714 used by the user design 206 via a connection 720. The connections 716 and 718 are implemented using the programmable interconnect of the PLD 202. The connection 720 is implemented using clock resources of the PLD 202 (e.g., horizontal/vertical clock spines of a clock distribution network).

FIG. 8 shows the hardware block 700 after partial reconfiguration with a state access bitstream has been performed. As shown, the connections 716 and 718 between the hardware block 700 and the user design 206 are severed. Instead, the input pins 702 and the output pin 712 are coupled to the state access logic 222 via connections 722 and connections 723, respectively. The clock pin 713 is coupled to a clock source 715 used by the state access logic 222 via a connection 724. The connections 722 are implemented using the programmable interconnect of the PLD 202. The connection 724 is implemented using clock resources of the PLD 202.

The state access logic 222 may initialize the registers 706 and 710 by applying appropriate values to the input pins 702. For example, the state access logic 222 may drive the input pin 702-1 with a constant logic '1'. The state access logic 222 may drive the input pin 702-2 with a constant logic '0'. The values stored in the registers 706 and 710 are thus controlled by driving the input pin 702-3 with an appropriate sequence of logic values. For example, if the register 706 is to be initialized with a logic '1' and the register 710 is to be initialized to a logic '0', then the state access logic 222 applies a logic '0' followed by a logic '1' to the input pin 702-3.

The state access logic 222 may readback from the registers 706 and 710 by applying the appropriate values to the input pins 702 in a manner similar to initialization. For example, the state access logic 222 may drive the input pin 702-3 with a constant logic '0'. To read the values stored in the registers 706 and 710, the state access logic 222 reads from the output pin 712 for two clock cycles.

Figure 9:
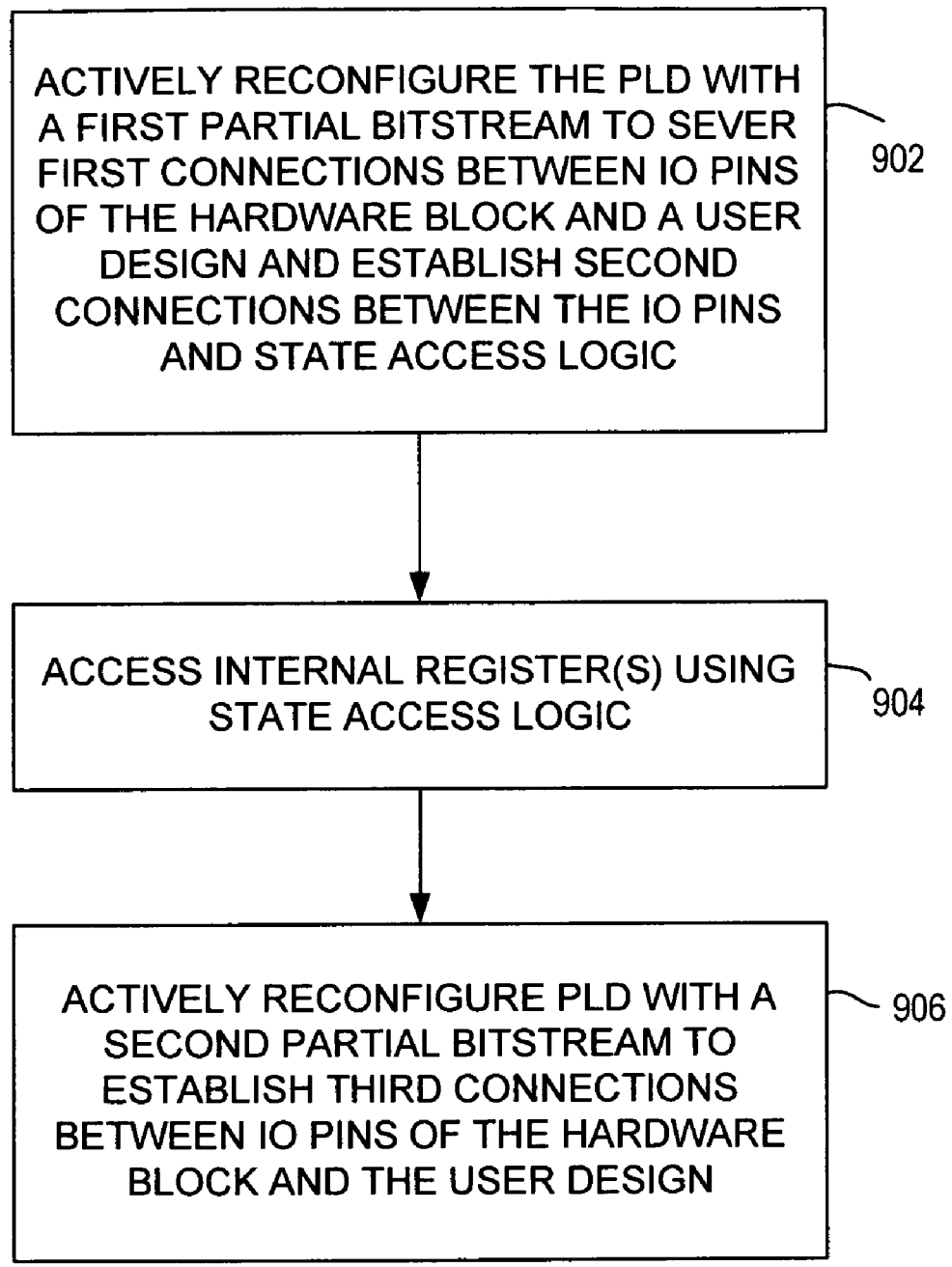
FIG. 9 is a flow diagram depicting an exemplary embodiment of a method of accessing at least one internal register of a hardware block in a PLD in accordance with one or more aspects of the invention.

FIG. 9 is a flow diagram depicting an exemplary embodiment of a method 900 of accessing at least one internal register of a hardware block in a PLD in accordance with one or more aspects of the invention. The method 900 begins at step 902. At step 902, the PLD is actively reconfigured with a first partial bitstream to sever first connections between IO pins of the hardware block and a user design, and establish second connections between the IO pins and state access logic. At step 904, the at least one internal register is accessed using the state access logic. For example, the state access logic may load the internal register(s) with initial state values (e.g., using the method 300 of FIG. 3) or read state values from the internal register(s) (e.g., using the method 600 of FIG. 6). At step 906, the PLD is actively reconfigured with a second partial bitstream to establish third connections between the IO pins and the user design.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of accessing at least one internal register of a hardware block in a programmable logic device (PLD), comprising:
    actively reconfiguring the PLD with a first partial bitstream to sever first connections between input/output (IO) pins of the hardware block and a user design, and establish second connections between the IO pins and state access logic;
    accessing the at least one internal register using the state access logic; and
    actively reconfiguring the PLD with a second partial bitstream to establish third connections between the IO pins and the user design.

2. The method of claim 1, wherein the state access logic comprises control logic, and wherein the step of accessing comprises:
    obtaining initial state data at the control logic; and
    loading the at least one internal register with the initial state data via the control logic.

3. The method of claim 2, wherein the first partial bitstream, the second partial bitstream, and the initial state data are obtained from a memory coupled to the PLD.

4. The method of claim 1, wherein the state access logic comprises configurable logic in the PLD, wherein the first partial bitstream programs the configurable logic to generate initial state data as output, and wherein the step of accessing comprises:
    loading the at least one internal register with the initial state data as output by the configurable logic.

5. The method of claim 4, wherein the configurable logic comprises at least one lookup-table (LUT).

6. The method of claim 1, wherein the state access logic comprises control logic, and wherein the step of accessing comprises:
   reading state data from the at least one internal register at the control logic; and
   outputting the state data via the control logic.

7. The method of claim 1, wherein the step of actively reconfiguring the PLD with the first partial bitstream further comprises:
   switching a clock source coupled to clock pins of the hardware block from a first clock source of the user design to a second clock source of the state access logic.

8. The apparatus of claim 1, wherein the state access logic comprises:
   configurable logic in the PLD, the configurable logic being programmed by the first partial bitstream to generate initial state data as output to be loaded into the at least one internal register.

9. The apparatus of claim 8, wherein the configurable logic comprises at least one lookup-table (LUT).

10. An apparatus for accessing at least one internal register of a hardware block in a programmable logic device (PLD), comprising:
    state access logic configured to access the at least one internal register in response to active reconfiguration of the PLD with a first partial bitstream that severs first connections between input/output (IO) pins of the hardware block and a user design and establishes second connections between the IO pins and the state access logic, the state access logic further configured to trigger active reconfiguration of the PLD with a second partial bitstream that establishes third connections between the IO pins and the user design.

11. The apparatus of claim 10, wherein the state access logic comprises:
    control logic configured to obtain initial state data and load the at least one internal register with the initial state data.

12. The apparatus of claim 11, wherein the control logic is configured to receive the first partial bitstream, the second partial bitstream, and the initial state data from a memory coupled to the PLD, the control logic configured to provide the first partial bitstream and the second partial bitstream to a configuration access port of the PLD.

13. The apparatus of claim 10, wherein the state access logic comprises:
    control logic configured to read state data from the at least one internal register and output the state data.

14. A programmable logic system, comprising:
    a programmable logic device (PLD), including:
       a user design configured therein;
       a hardware block having at least one internal register and input/output (IO) pins coupled to the user design;
       state access logic configured to access the at least one internal register in response to a first active reconfiguration of the PLD;
       configuration logic configured to initiate the first active reconfiguration using a first partial bitstream that severs first connections between the IO pins and the user design and establishes second connections between the IO pins and the state access logic, the configuration logic further configured to initiate a second active reconfiguration using a second partial bitstream that establishes third connections between the IO pins and the user design.

15. The programmable logic system of claim 14, further comprising:
    a memory, coupled to the PLD, configured to store the first partial bitstream and the second partial bitstream.

16. The programmable logic system of claim 14, wherein the state access logic comprises:
    control logic configured to obtain initial state data and load the at least one internal register with the initial state data.

17. The programmable logic system of claim 14, wherein the state access logic comprises:
    configurable logic in the PLD, the configurable logic being programmed by the first partial bitstream to generate initial state data as output to be loaded into the at least one internal register.

18. The programmable logic system of claim 17, wherein the configurable logic comprises at least one lookup-table (LUT).

19. The programmable logic system of claim 14, wherein the state access logic comprises:
    control logic configured to read state data from the at least one internal register and output the state data.

20. The programmable logic system of claim 14, wherein the first partial bitstream is further configured to switch a clock source coupled to clock pins of the hardware block from a first clock source of the user design to a second clock source of the state access logic.

* * * * *